(12) United States Patent
Markic et al.

(10) Patent No.: US 10,326,338 B2
(45) Date of Patent: Jun. 18, 2019

(54) ACTIVE RECTIFIER FOR ALTERNATOR

(71) Applicant: Sieva, Podjetje Za Razvoj In Trzenje V Avtomobilski Industriji, D.O.O., Sempeter Pri Corici (SI)

(72) Inventors: Stojan Markic, Kojsko (SI); Gorazd Modrijan, Nova Gorica (SI); Robert Rescic, Nova Gorica (SI); Tomaz Curk, Ajdovscina (SI)

(73) Assignee: SIEVA, PODJETJE ZA RAZVOJ IN TRZENJE V AVTOMOBILSKI INDUSTRIJI, D.O.O. (SI)

( * ) Notice: Subject to any disclaimer, the term of this patent is extended or adjusted under 35 U.S.C. 154(b) by 303 days.

(21) Appl. No.: 15/328,017

(22) PCT Filed: Jul. 23, 2014

(86) PCT No.: PCT/SI2014/000043
§ 371 (c)(1),
(2) Date: Jan. 20, 2017

(87) PCT Pub. No.: WO2016/013987
PCT Pub. Date: Jan. 28, 2016

(65) Prior Publication Data
US 2017/0163127 A1      Jun. 8, 2017

(51) Int. Cl.
| | |
|---|---|
| *H05K 7/20* | (2006.01) |
| *H02K 11/04* | (2016.01) |
| *H01L 25/07* | (2006.01) |
| *H02M 7/00* | (2006.01) |

(52) U.S. Cl.
CPC ........ *H02K 11/046* (2013.01); *H01L 23/3121* (2013.01); *H01L 23/3675* (2013.01);
(Continued)

(58) Field of Classification Search
CPC ..... H01L 23/5386; H01L 25/18; H01L 24/72; H02M 7/003; H05K 7/209; H05K 7/20
(Continued)

(56) References Cited

U.S. PATENT DOCUMENTS 6,563,726 B1   5/2003   Hirst
7,292,445 B2   11/2007  Linke
(Continued)

FOREIGN PATENT DOCUMENTS

CN   101542902 A   9/2004
CN   103746577 A   4/2014
(Continued)

OTHER PUBLICATIONS

"IGBT drive and protection circuit design and application circuit example" pp. 41-46, dated Jan. 31, 2014.
(Continued)

*Primary Examiner* — Rajnikant B Patel
(74) *Attorney, Agent, or Firm* — Fishman Stewart PLLC

(57) ABSTRACT

An active rectifier of a rotary electric machine, in particular an active rectifier for alternators, for example for rectifying alternating currents (AC) to direct currents (DC) for charging batteries on vehicles, is disclosed. The active rectifier may include a plurality of power MOSFET transistors and a detecting and driving circuitry all mounted on a single substrate to form a half-bridge module. A number of at least two and up to N modules may be connected together to serve as a two and up to N-phase rectifier. Each module is connected in a way to rectify currents from one phase of the electric machine and has an individual power supply for the detecting and driving circuitry. The power supply may receive the power from the phase which is being rectified and operates independently of the alternator's voltage regulator.

20 Claims, 4 Drawing Sheets

(51) Int. Cl.
| | |
|---|---|
| *H01L 23/31* | (2006.01) |
| *H01L 23/367* | (2006.01) |
| *H01L 23/373* | (2006.01) |
| *H01L 23/538* | (2006.01) |
| *H01L 25/11* | (2006.01) |
| *H01L 25/18* | (2006.01) |
| *H01L 29/78* | (2006.01) |
| *H01L 29/866* | (2006.01) |

(52) U.S. Cl.
CPC ...... *H01L 23/3736* (2013.01); *H01L 23/5386* (2013.01); *H01L 25/072* (2013.01); *H01L 25/115* (2013.01); *H01L 25/18* (2013.01); *H02M 7/003* (2013.01); *H05K 7/209* (2013.01); *H05K 7/20409* (2013.01); *H01L 29/78* (2013.01); *H01L 29/866* (2013.01); *H01L 2924/0002* (2013.01)

(58) Field of Classification Search
USPC .... 361/718, 699, 324, 624; 257/500, E27.08
See application file for complete search history.

(56) References Cited

U.S. PATENT DOCUMENTS

| | | | |
|---|---|---|---|
| 7,362,001 B2* | 4/2008 | Kusumi | H02J 7/248 290/31 |
| 7,456,531 B2 | 11/2008 | Yagi | |
| 7,978,471 B2* | 7/2011 | Tokuyama | H01L 23/36 361/699 |
| 8,174,214 B2* | 5/2012 | Sells | H02M 7/219 318/268 |
| 8,531,856 B2 | 9/2013 | Masson et al. | |
| 8,964,436 B2* | 2/2015 | Kwong | H02M 7/219 363/132 |
| 9,641,097 B2* | 5/2017 | Mehringer | H02M 7/219 |
| 2003/0168252 A1 | 9/2003 | Schmid et al. | |
| 2006/0151874 A1 | 7/2006 | Milich et al. | |
| 2007/0195563 A1 | 8/2007 | Shiraishi et al. | |
| 2011/0215840 A1 | 9/2011 | Machida | |

FOREIGN PATENT DOCUMENTS

| | | |
|---|---|---|
| JP | 2005-045878 A | 2/2005 |
| WO | WO-2014030458 A1 | 2/2014 |

OTHER PUBLICATIONS

Chinese Office Action dated Jun. 13, 2018 related to corresponding Chinese Patent Application No. 201480080656.7.
Chinese Office Action related to corresponding Chinese Patent Application No. 201480080656.7 dated Jan. 16, 2019.

* cited by examiner

ACTIVE RECTIFIER FOR ALTERNATOR

CROSS REFERENCE TO RELATED APPLICATIONS

This application is a US National Phase Application of PCT/SI2014/000043, filed on Jul. 23, 2014, which is hereby incorporated by reference in its entirety.

TECHNICAL FIELD

The object of this patent application relates to a structure of an active rectifier (intended mainly for rectifying alternating currents of rotary electric machines and in particular of alternators), in which power MOSFET transistors are provided instead of conventionally used power diodes. The MOSFET transistors provide a reduced voltage drop across the rectifier and increase the overall alternator efficiency.

The invention is related to categories: H05K 7/20; H01L23/34, H01L25/07, H02J7/00, H02K11/04, H02M7/12.

BACKGROUND

Alternating current (AC) rotary electric machines which are used in the function of DC electric generators typically integrate diodes to rectify alternating currents to required DC currents. Alternators (which are intended for charging batteries in starting systems in vehicles or in stationary equipment such as gen-sets or similar) in particular have power diodes connected in rectification circuitry. Semiconductor power diodes work with an unavoidable voltage drop in the range from 0.6 V to 1 V per diode in the forward conducting direction. This voltage drop represents a significant power loss while conducting the generated currents to the battery or to other electrical loads. Consequently, alternators have a rather low operational efficiency, particularly those intended for low system voltages of 14 V or 28 V.

The technical problem to be solved is to provide such a rectifier structure that would allow the rectifier to operate without an outside connection to power supply (usually 12 V) and independently of other electronic circuitry (such as voltage regulators of an alternator). Such a rectifier would eliminate a need for any connection other than the power output to a vehicle installation. In addition, it is desirable for the structure of the rectifier to be configured in a way that it would replace a normal diode rectifier in the same location on an alternator without altering simple air cooling and existing mounting in order not to increase the production costs of the machine.

Using MOSFET transistors preferably of a TOLL type (TO-Leadless Package) with sufficiently low resistance reduces an unwanted voltage drop of 0.6 V-1 V to the range of 0-0.2 V, therefore proportionally also reducing power losses of the alternator and making it more efficient. Mounting transistors in the same place as diodes and not altering the forced air ventilation for cooling allows the remade alternators to operate with a lower working temperature of its critical parts (brushes, rotor rings and bearings), reduces their wearing and consequently increases the life time of alternators. There are a few known solutions to the active rectifier. An example is proposed in the patent publication U.S. Pat. No. 7,292,445 B2 which describes a voltage regulator integrated with an active rectifier for charging the battery more efficiently. The integrated multilayer device is mounted on a separate aluminum base plate with water cooling and the entire assembly is mounted on the side of an existing alternator as an extension which increases its overall diameter. The proposed solution requires a detecting and driving circuitry to be connected to a power supply from the outside.

Another example is proposed in the patent publication US2006151874. The proposed solution is comprised of a power circuit which is controlled by a control part. All power-conducting components of the power circuit are power MOS components and are integrated in a stacked construction which integrates two parallel substrates, between which the power MOS components are placed and with contacts at both sides.

Both of the above examples need a connection to a power supply through a connector and wires in a vehicle harness. This requires an additional installation of wires in the system and introduces a dependency on an outside power supply.

SUMMARY

The invention solves the technical problems associated with the connection of a rectifier such that a connection to the power supply is not necessary. In a traditional rectifier structure which uses power diodes a connection to the power supply from the outside was not necessary. With the introduction of power MOSFET transistors as a replacement for diodes, the included detecting and driving circuitry needs a power supply voltage in order for the corresponding control circuitry to operate. The detecting and driving circuitry provides the control signals that switch the transistors on and off synchronously with the alternating output voltage of the electric generator and thus provide for synchronous rectification. The unwanted voltage drop in the forward conducting direction normally associated with diodes is detected and significantly reduced by switching on the MOSFET transistors. Because the voltage drop across the semiconductor is reduced, the power losses across the rectifier are also reduced and consequently the overall generator efficiency is improved. This improvement also leads to a lowering of the operating temperature of the critical wearing parts of the alternator.

The structure of the active rectifier of the invention is such that it is comprised of N connected modules, where each of them has a half-bridge configuration and replaces the two diodes that would normally be connected to the same phase of the generator. Typically three equal modules are needed to form a three-phase alternator rectifier. The electrical connection of the modules of the alternator is identical to the connection of conventional diode rectifiers. Generators with a bigger or smaller number of phases need an adequately bigger or smaller number of equal modules.

Each MOSFET transistor has its own zero-crossing detecting and driving circuitry made of small signal electronics, assembled in the MOSFET's vicinity and mounted on a single substrate with a good thermal contact with the aluminum housing of the module which is also a heat sink placed in the air stream of the forced air cooling of the alternator. Each module is internally connected to the phase which is being rectified and uses the phase's power for supplying the detecting and driving circuitry. This makes the module independent on the vehicle system voltage and alternator's voltage regulator. The module does not need any additional connection. The rectifier as described in the continuation introduces only insignificant modifications in the manufacturing process of alternators (or other generators) and thus efficiently maintains their low production costs. By using three identical modules the rectification function of a three-phase rectifier is achieved. The modular structure of the rectifier allows a composition of multi-phase rectifiers, in which a minimum of two modules for two-phase systems and up to N-modules for N-phase systems can be used. In summary, the modular structure enables the use of equal modules for the construction of rectifier bridges in generators that have less or more than 3 phases. Furthermore, a device comprised of two such modules can efficiently act as a rectifier for a non-rotating power supply such as a low frequency transformer (for example for the use in a battery charger).

A rather important advantage of the described active half-bridge module is the cooling of the module and as a consequence also of the entire rectifier which can be done by forced air cooling alone. This patent includes a description of a cooler element made of metal, preferably but not exclusively made from casted aluminum, which has cooling ribs oriented in parallel to the direction of the alternator shaft, and which is further located in the airflow stream passing through the alternator.

The active rectifier has its own power supply for the detecting and driving circuitry, so it operates independently of the alternator voltage regulator. Wiring to the outside power supply is therefore eliminated.

When used on an alternator, the rectifier has at least two power zener diodes (connected in series which makes them resistant to wrong polarity connections) between its output terminals in order to clamp the voltage during load dump conditions. The zener diodes should have a zener voltage preferably in the range from 16 V to 32 V to clamp the alternator's voltage in the range from 32 V to 64 V. Because of the harsh environment, to which the modules of the active rectifier are exposed, they should be coated with a potting material all over the electronic components except over the connection terminals.

DETAILED DESCRIPTION

The structure of the active rectifier of the invention consists of N-connected modules, where each of them has a half-bridge configuration and replaces two diodes of a passive rectifier that would be normally connected to the phase of an electric generator. Typically three equal modules are needed to form a three-phase alternator rectifier. The electrical connection on an alternator 30 is identical to the connection of a conventional diode rectifier. Phase terminals 22 are the inputs of the rectifier and common terminals B+ and B− are the output of the rectifier.

Figure 1:
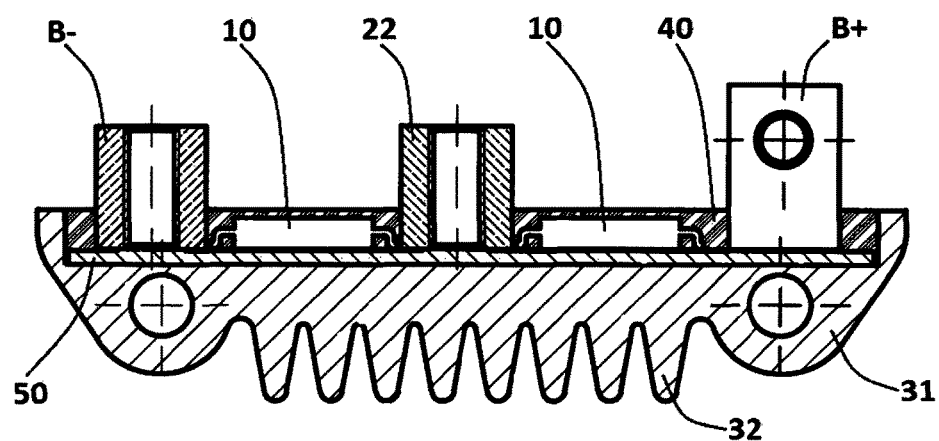
FIG. 1 shows a cross section view of a half-bridge active rectifier module showing a single substrate including power MOSFET transistors with a zero-crossing detecting and driving circuitry placed on the same substrate, the whole mounted on a cooling element.

As illustrated in FIG. 1, all electrical components (including power MOSFET transistors 10, small signal electronic components in the corresponding detecting and driving circuitry 20, as well as a 15 V voltage supply 15 for supplying said detecting and driving circuitry) are placed on a common single substrate 50. The substrate 50 must have a good mechanical and thermal contact with a module's housing 31 which is provided by an adhesive applied between these two. The module's housing 31 should have a plurality of cooling ribs 32 in order to provide efficient cooling when exposed to an air stream flowing through the alternator 30.

The substrate 50 of each half-bridge module 5 supports three high-current terminals B+ and B−, which serve as connection terminals between the phase terminals of the active rectifier electronics and the alternator 30. In order to provide sufficient protection against automotive environmental condition all the electronic components on the substrate 50 assembled on the module's housing 31 are coated with a potting material 40.

Figure 2:
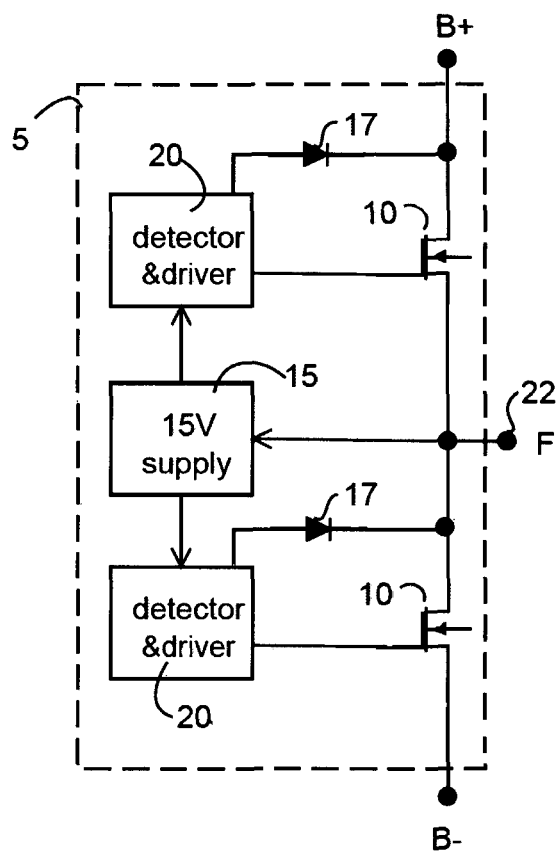
FIG. 2 shows an electric block diagram of one half-bridge configuration of the rectifier module.

FIG. 2 shows an electric block diagram of a half-bridge configuration of the active rectifier module. The main conductive elements in the proposed active rectifier are power MOSFET transistors 10. The purpose of the active rectifier operation is to synchronously switch on the transistors 10 with the phase voltage generated by the alternator 30 and efficiently conduct the phase current with a minimum voltage drop during the conducting half-period. To achieve this, the MOSFET transistors 10 have to be driven by an appropriate gate voltage such that the drain-to-source voltage of the MOSFET is maintained below 0.2 V. A diode 17 senses the drain voltage of the transistor 10. During the conductive rectification period the sensed voltage from the diode 17 is delivered to a detecting and driving circuitry 20 which outputs the voltage for the gate of the MOSFET transistor. The driving voltage thus produced must lie between the transistor's gate threshold voltage and the 15 V supply voltage and should be regulated in order to maintain the desired voltage drop across the MOSFET transistor below 0.2 V.

The 15 V supply 15 takes the AC voltage from the phase terminal 22, rectifies it and stabilizes it to the desired 15 V DC to properly supply the detector and driver circuitry 20. Each of the half-bridge modules 5 has one 15 V supply 15 which provides the supply for both high-side and low-side MOSFET transistors 10. The modules configured in this way have no outgoing terminals or pins for the 15 V supply, which is necessary for the functioning of the detector and driver circuitry 20. Having the voltage supply 15 connected to the phase terminal 22, the active rectifier therefore operates independently of the system voltage and independently of the voltage regulator on said generator. A connection to a vehicle's installation is consequently simplified.

Figure 3:
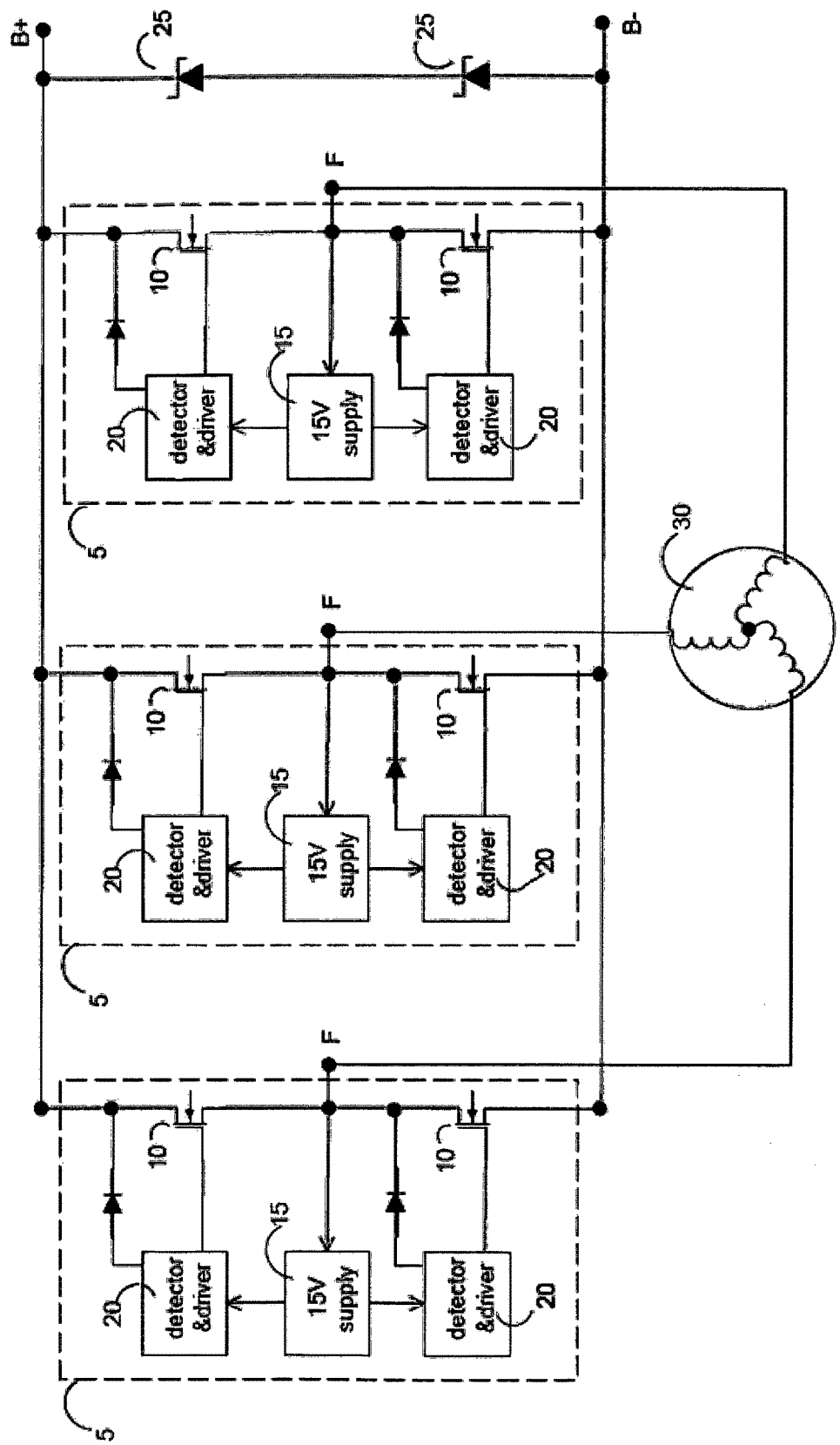
FIG. 3 shows a block diagram of a three-phase rectifier configuration including a connection of two protective zener diodes.

FIG. 3 illustrates a connection of three identical half-bridge modules 5 for a typical three-phase rectifier configuration, where all B+ and B− terminals are connected together to provide the DC output of the generator and where each module phase terminal 22 is connected to one phase of the alternator 30. An alternator working in automotive conditions is sometimes exposed to a so-called load dump condition, in which a high voltage spike is generated which could damage the electronic components in the active rectifier. To prevent this, two power zener diodes 25 connected in series are connected between the B+ and B− terminals of the rectifier. For low voltage systems (14 V or 28 V) the use of zener diodes 25 with a nominal voltage in the range from 16 V to 32 V is preferred. For a reliable operation, the sum of both zener diode 25 voltages must be lower than the nominal break down voltage of the MOSFET transistors 10 used in the active rectifier.

Figure 4:
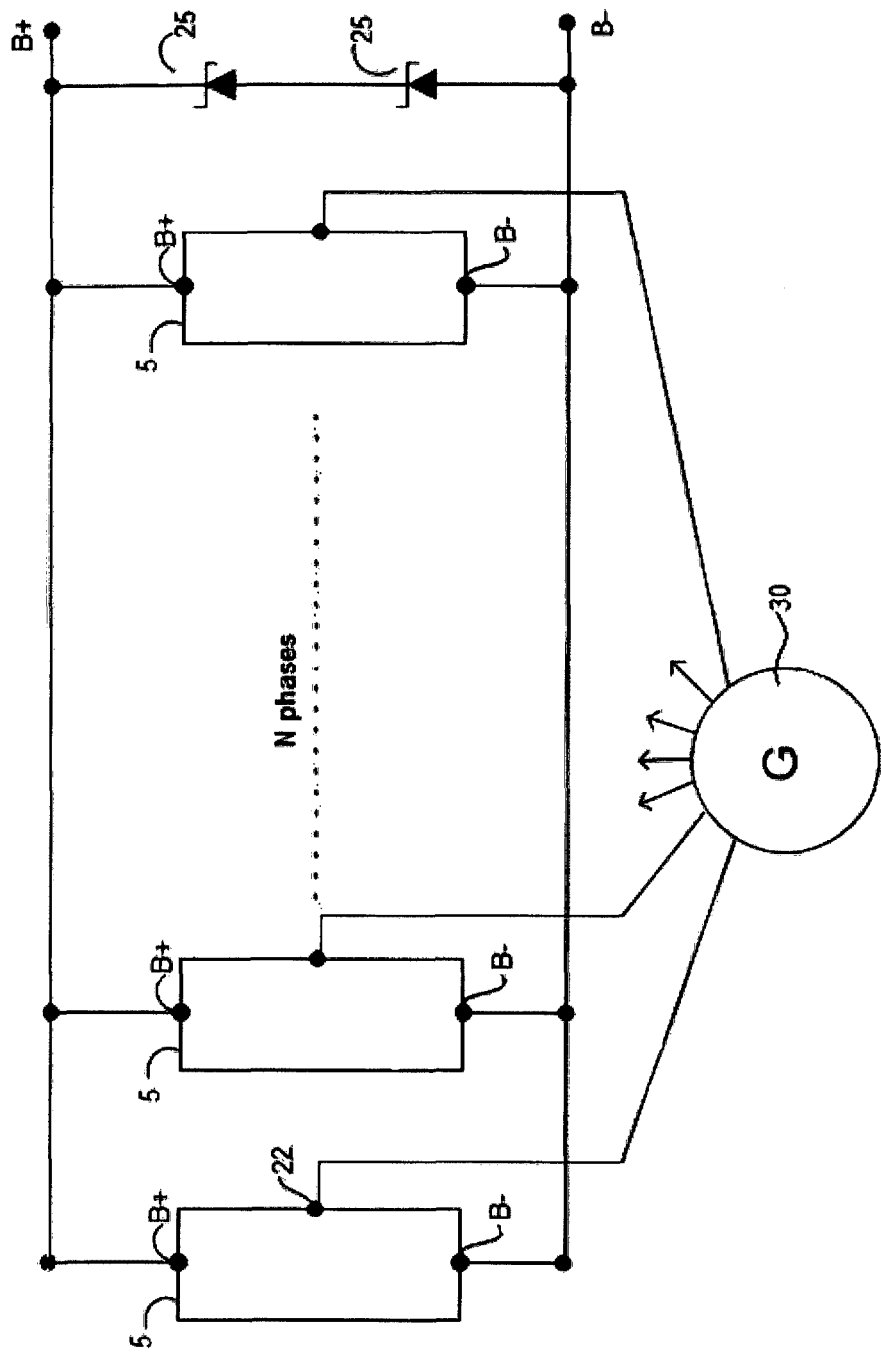
FIG. 4 shows a connection diagram of a multiphase rectifier consisting of a plurality of identical half-bridge modules and protective zener diodes.

FIG. 4 illustrates a connection diagram of a multiphase rectifier consisting of a plurality of identical half-bridge modules 5. One pair of protective zener diodes 25 needs to be included in the N-phase active rectifier.

We claim:

1. A structure of an active rectifier in conjunction with an electric generator, comprising:
    a plurality of power MOSFET switches;
    a detecting and driving circuitry disposed proximate to the plurality of power MOSFET switches, wherein the plurality of power MOSFET switches and the detecting and driving circuitry are mounted on a single substrate in such an electrical connection to provide a half-bridge module for one-phase synchronous rectification of the electrical source, and wherein the single substrate is mounted in a heat sink element defining a one-phase rectifier half-bridge module; and
    a number of at least two and up to N identical rectifier modules that form a two and up to N phase rectifier;
    wherein the detecting and driving circuitry has an individual voltage supply connected to a phase terminal and receives a supply voltage from a phase of the electric generator.

2. The structure according to claim 1, further comprising a pair of power zener diodes connected in series and said pair of power zener diodes connected in parallel to rectifier output terminals B+ and B−, wherein the pair of power zener diodes each have a voltage in a voltage range from 16 V to 32 V.

3. The structure according to claim 1, wherein the half-bridge module, is coated with a potting material, and wherein the potting material is spread entirely across the single substrate and disposed in the heat sink element.

4. The structure according to claim 1, wherein the heat sink element includes a plurality of air cooling ribs oriented in parallel with a rotor shaft of the electric generator.

5. The structure according to claim 4, wherein the heat sink element includes an aluminum cast housing, and wherein the plurality of ribs are disposed on a side of the housing opposite the single substrate.

6. The structure according to claim 5, wherein the half-bridge module is coated with a potting material, and wherein the potting material is spread across the single substrate and disposed in the aluminum cast housing.

7. The structure according to claim 1, wherein at least one of the plurality of power MOSFET switches includes a leadless MOSFET transistor.

8. The structure according to claim 1, wherein the heat sink element includes an aluminum cast housing.

9. The structure according to claim 8, further comprising a plurality of air cooling ribs disposed on the aluminum cast housing.

10. The structure according to claim 2, wherein the half-bridge module is coated with a potting material, and wherein the potting material is spread across the single substrate and disposed in the heat sink element.

11. The structure according to claim 10, wherein the heat sink element includes a plurality of air cooling ribs oriented in parallel with a rotor shaft of the electric generator.

12. The structure according to claim 3, wherein the heat sink element includes a plurality of air cooling ribs oriented in parallel with a rotor shaft of the electric generator.

13. An active rectifier structure for an alternator, comprising:
    a heat sink element;
    a single substrate mounted in the heat sink element;
    a plurality of power MOSFET switches;
    a detecting and driving circuitry disposed proximate to the plurality of power MOSFET switches, wherein the plurality of power MOSFET switches and the detecting and driving circuitry are mounted on the single substrate in such an electrical connection to provide a one-phase rectifier half-bridge module for one-phase synchronous rectification of the electrical source; and
    a number of at least two and up to N identical rectifier modules that provide a two and up to N phase rectifier;
    wherein the detecting and driving circuitry has an individual voltage supply connected to a phase terminal and receives a supply voltage from a phase of the alternator.

14. The active rectifier structure according to claim 13, further comprising a pair of power zener diodes connected in series and said pair of power zener diodes connected in parallel to rectifier output terminals B+ and B−.

15. The active rectifier structure according to claim 14, wherein the pair of power zener diodes each have a voltage in a voltage range from 16 V to 32 V.

16. The active rectifier structure according to claim 13, wherein the one-phase rectifier half-bridge module is coated with a potting material, and wherein the potting material is spread entirely across the single substrate and disposed in the heat sink element.

17. The active rectifier structure according to claim 13, wherein the heat sink element includes a plurality of air cooling ribs oriented in parallel with a rotor shaft of the alternator.

18. The active rectifier structure according to claim 13, wherein at least one of the plurality of power MOSFET switches includes a leadless MOSFET transistor.

19. The active rectifier structure according to claim 13, wherein the heat sink element includes an aluminum cast housing and the single substrate is mounted in the aluminum cast housing.

20. The active rectifier structure according to claim 19, further comprising a plurality of air cooling ribs disposed on the aluminum cast housing.

* * * * *